United States Patent [19]

Saito et al.

[11] Patent Number: 4,803,375
[45] Date of Patent: Feb. 7, 1989

[54] IMAGE SENSORS AND METHODS OF MANUFACTURING SAME INCLUDING SEMICONDUCTOR LAYER OVER ENTIRE SUBSTRATE SURFACE

[75] Inventors: Tamio Saito, Tokyo; Satoshi Takayama, Kawasaki; Yoshiyuki Suda; Osamu Shimada, both of Yokohama; Ken-ichi Mori, Tokyo, all of Japan

[73] Assignee: Kabushiki Kaisha Toshiba, Kawasaki, Japan

[21] Appl. No.: 941,192

[22] Filed: Dec. 12, 1986

[30] Foreign Application Priority Data

Dec. 27, 1985 [JP] Japan .................. 60-294054
Mar. 28, 1986 [JP] Japan .................. 61-68665

[51] Int. Cl.[4] ............... H01J 40/14; H01L 27/14
[52] U.S. Cl. ................... 250/578; 357/30; 437/226
[58] Field of Search ........... 250/578, 211 J, 211 R, 250/211 K; 357/30, 31, 32, 59, 2, 4, 55; 358/213.11; 437/5, 226

[56] References Cited

U.S. PATENT DOCUMENTS

| | | | |
|---|---|---|---|
| 4,288,702 | 9/1981 | Ozawa et al. | 250/578 |
| 4,347,436 | 8/1982 | Fukuda et al. | 250/578 |
| 4,354,104 | 10/1982 | Chikamura et al. | 250/211 J |
| 4,591,917 | 5/1986 | Suzuki | 358/213 |
| 4,607,168 | 8/1986 | Oritsuki et al. | 250/578 |
| 4,620,058 | 10/1986 | Winterling et al. | 357/30 |
| 4,650,984 | 3/1987 | Furushima et al. | 250/578 |
| 4,660,089 | 4/1987 | Lee | 358/213 |
| 4,663,535 | 5/1987 | Nakai et al. | 250/578 |
| 4,665,008 | 5/1987 | Nishiura et al. | 430/314 |
| 4,665,422 | 5/1987 | Hirao et al. | 357/30 |
| 4,672,221 | 6/1987 | Saito et al. | 250/578 |

FOREIGN PATENT DOCUMENTS 61-75560  4/1986  Japan .
1559473  7/1976  United Kingdom .

Primary Examiner—David C. Nelms
Assistant Examiner—Michael Messinger
Attorney, Agent, or Firm—Foley & Lardner, Schwartz, Jeffery, Schwaab, Mack, Blumenthal & Evans

[57] ABSTRACT

An image sensor, comprising a semiconductor layer formed on at least a first region of a substrate; first electrodes arranged in line and electrically connected to the semiconductor layer of said first region; and second electrodes arranged in line and electrically connected to said semiconductor layer of said first region. The second electrodes are respectively formed as a common electrode, and each of the first electrodes, a portion of said second electrode facing the first electrode and the semiconductor layer positioned therebetween form a photo-sensing element. First wires respectively extend from said first electrodes to a second region of said substrate. An insulating layer is continuously formed on the first and second regions, covering said photo-sensing elements and the first wires as well as second wires formed in parallel on the insulating layer of said second region. The second wires are electrically connected to the first wires at through holes formed in the insulating layer.

27 Claims, 4 Drawing Sheets

IMAGE SENSORS AND METHODS OF MANUFACTURING SAME INCLUDING SEMICONDUCTOR LAYER OVER ENTIRE SUBSTRATE SURFACE

BACKGROUND OF THE INVENTION

The present invention relates to image sensors, in particular to image sensors which use a photo-sensing element array and matrix wires, and methods of manufacturing same.

One form of a long-length image sensor such as the contact type image sensors, makes use of the photoconductive effect. FIG. 1 is an illustration of such an image sensor. On a glass substrate 1, $CdS_{0.2}Se_{0.8}$:Cu layers 2 are arranged in a line shape. Then, electrodes 3, 4 facing each other and wires 5 are made from NiCr-Au layers. The electrodes 3 are formed as common electrodes for each group. After that, a film lead 6 is attached. The number 7 denotes polyimide films.

A fine pattern is difficult to produce on this structure because of the film lead 6, and the inability to accurately attach some, so that this technology is not appropriate to accomplish image sensors having a small width.

FIG. 2 is a diagram showing an image sensor made by the present inventor prior to the instant invention. In FIG. 2, there is illustrated an insulating substrate 21, on which is formed a semiconductor layer 22 such as a hydrogenated amorphous silicon (a-Si:H) layer and opposing electrodes 23 and 24. The electrodes 24 which have portions 24, are common electrodes for each photo-sensing element. The opposing electrodes 23 extend to form second wires 25. The second wires 25 respectively connect to first wires 26 which are formed parallel to the direction of disposition of the array of elements at the through holes C that are formed at the intersections of the first and second wires 25, 26 in the insulating layer 27 (for example, polyimide, epoxy, or the like).

When light reflected from the surface of a manuscript is to impinge upon the photo-sensing array, the electrical resistance of the elements changes in response to the amount of light incident upon the array. Thus, the image on the manuscript can be read, for example, by successively applying a voltage to the common electrodes 24 and by reading the changes in the resistance as electrical signals through successive scanning of the first wires 26.

However, an image sensor of this configuration has a number of disadvantages as discussed below.

The semiconductor layer 22 is generally formed in band form in the photo-sensing region by a masked plasma CVD method or the like. However, the amount of protrusion in the direction of the width of the semiconductor layer 22 has an unevenness due to nonuniformity of the contact between the mask and the substrate. Since the film thickness at the edge of the protrusion in the semiconductor layer 22 is nonuniform, if the insulating layer 28 is formed in that section in an overlapping manner, the adhesion of the insulating layer 28 is unstable. Therefore, the separation between the semiconductor layer 22 and the insulating layer 28 has to be made sufficiently large in order to avoid overlapping of the insulating layer 28 at the edge section of the semiconductor layer 22, which leads to a large size of the image sensor.

In order to eliminate the above problem, it is conceivable to spread the semiconductor layer 22 on the entire surface of the substrate 21, and subsequently remove areas except for the narrow band photo-sensing region utilizing, for example, a photoresist/etching technique. However, the etching of the semiconductor layer 22 involves the processes of coating of photoresist, exposure, and development of a resist and then removal of the resist, so that these steps become factors resulting in an increase in cost. Moreover, yield will also be reduced due to an increase in the number of required processes.

Furthermore, if the semiconductor layer 22 is first formed, the semiconductor layer 22 will be altered by the action of the etchant in the etching process for the insulating layer 28.

On the other hand, if the semiconductor layer 22 is formed after the formation of the insulating layer 28, it is difficult to form the semiconductor layer 22 with high quality due to the influence of the material for the insulating layer 28. In addition, there is a problem of damaging the insulating layer 28 caused by cleansing solutions such as a mixture of hydrogen peroxide and ammonia which is used for cleansing as a pre-treatment to the formation of the semiconductor layer 22.

Furthermore, in the above approach, the photoconductive layer and the insulating layer are made by different steps. However, it is desired to reduce the manufacturing steps for accomplishing high yield and lower cost.

Moreover, in the structure of FIG. 2, it is preferable to form additionally a protective insulating film on the photo-sensing element array, leading to a further increase in the number of manufacturing steps.

SUMMARY OF THE INVENTION

Accordingly, an object of the present invention is to provide improved image sensors.

Another object of the invention is to provide improved image sensors having a small width.

A further object of the invention is to provide improved image sensors for accomplishing high reliability.

Yet another object of the invention is to provide improved image sensors for accomplishing high yield.

An additional object of the invention is to provide improved image sensors enabling reduced manufacturing steps.

Still another object of the invention is to provide improved methods of manufacturing image sensors.

In accomplishing the foregoing objects there is provided according to one aspect of the invention an image sensor, comprising:

a semiconductor layer formed at least on a first region of a substrate;

first electrodes arranged in line, and electrically connected to the semiconductor layer of said first region;

electrode portions arranged in line, and electrically connected to the semiconductor layer of said first region, groups of the electrode portions each having a common electrode, and each of said first electrode, the portion of said common second electrode facing to the first electrode and said semiconductor layer positioned between the first electrode and the portion of said common second electrode comprising a photo-sensing element;

first wires respectively extended from the first electrodes to a second region of the substrate;

an insulating layer continueously formed on the first and second region, covering the photo-sensing elements and said first wires; and second wires formed in parallel on the insulating layer of said second region, the second wires electrically connected to said first wires at through holes formed in said insulating layer.

According to another aspect of the invention there is provided an image sensor, comprising:

a plurality of photo-sensing elements arranged in line on a first region of a substrate, each comprises an electrode pair and a semiconductor layer positioned between the electrode pair;

first wires respectively extended from one side electrode of the electrode pair to a second region of the substrate;

an insulating layer continueously formed on the first and second region, covering the photo-sensing elements and the first wires; and second wires formed in parallel on the insulating layer of the second region, the second wires electrically contacting the first wires at through holes formed in said insulating layer.

According to another aspect of the invention there is provided a method of manufacturing image sensors, comprising the steps of:

(i) forming a semiconductor layer at least on a first region of a substrate;

(ii) forming first electrodes, second electrodes and first wires, the first and second electrodes each arranged in line facing each other and electrically connected to the semiconductor layer of the first region, each of the second electrodes facing a plurality of the first electrodes, and the first wires respectively extended from the first electrodes to a second region of the substrate;

(iii) forming an insulating layer continuously on said first and second regions, covering the first electrodes, second electrodes and first wires, and the insulating layer having holes corresponding to the first wires;

(iv) forming a conductive layer on said insulating layer; and (v) patterning said conductive layer to form second wires formed in parallel on said insulating layer of the second region, electrically contacting the first wires at said through holes.

According to another aspect of the invention there is provided a method of manufacturing image sensors, comprising the steps of:

(i) forming a semiconductor layer on a plurality of image sensor regions of a substrate;

(ii) forming first electrodes, second electrodes and first wires on each image sensor region, the first and second electrodes are each arranged in line facing each other, each of said second electrodes adjacent a plurality of the first electrodes, and said first wires electrically connected to the first electrodes;

(iii) forming an insulating layer on the substrate, covering the first electrodes, second electrodes and first wires;

(iv) forming second wires in parallel contacting the first wires at through holes in the insulating layer; and (v) dicing the substrate to form a plurality of image sensors.

BRIEF DESCRIPTION OF THE DRAWINGS

This invention, together with its various features and advantages, will be readily understood from the following more detailed description presented in conjunction with the following drawings, in which:

FIG. 3b is a diagram showing a cross-sectional view along line A—A of FIG. 3a;

DETAILED DESCRIPTION OF THE PREFERRED EMBODIMENTS

Figure 1:
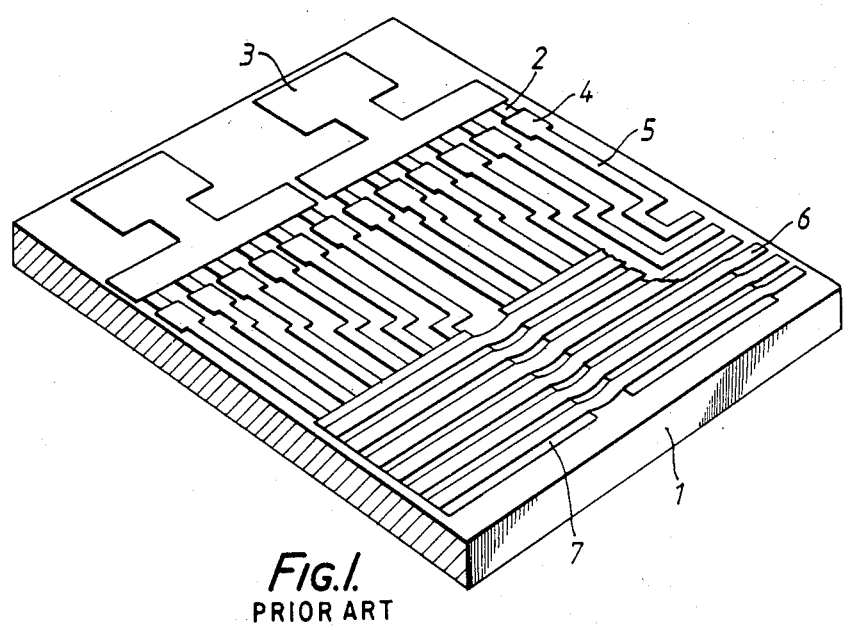
FIG. 1 is a diagram showing an image sensor of prior art.
Figure 2:
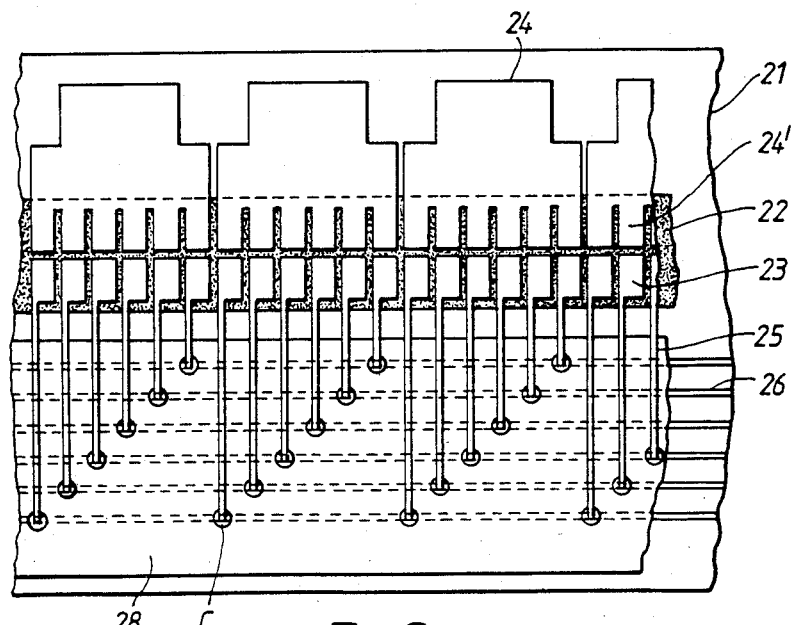
FIG. 2 is a diagram showing a plan view of an image sensor determined by the inventor in advance the present invention.
Figure 3A:
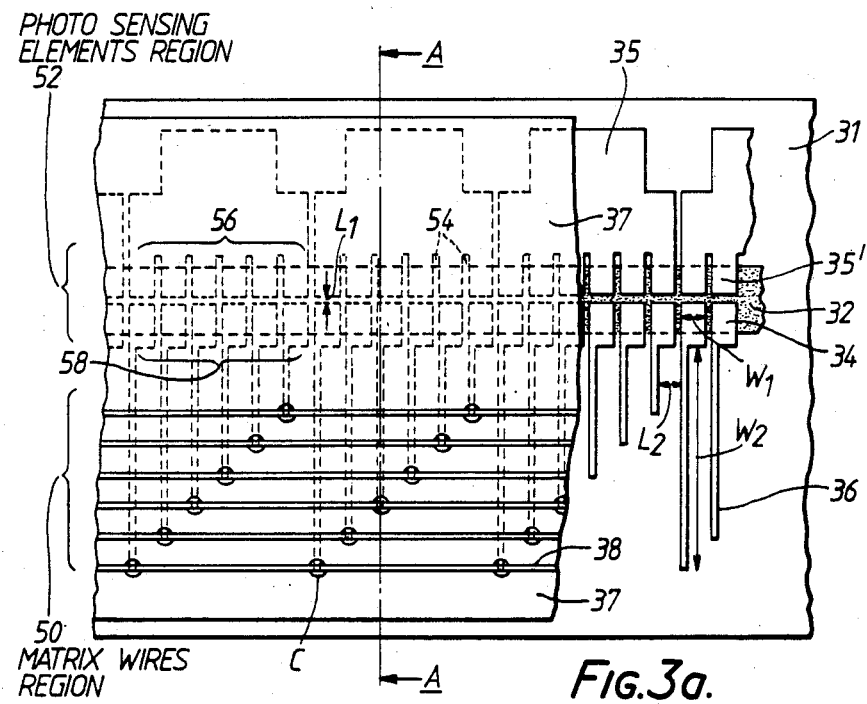
FIG. 3a is a drawing of an image sensor of the embodiment of the invention.
Figure 3B:
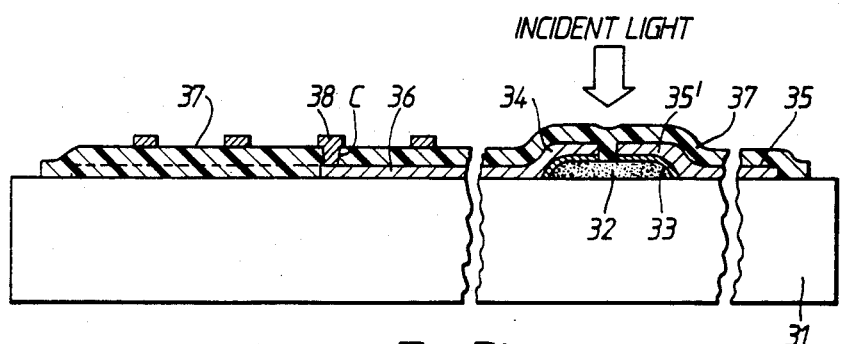

FIG. 3a is a plan view of an embodiment of the image sensor of the present invention and FIG. 3b is a cross-sectional view along line A—A in FIG. 3a.

In the figure, a substrate 31 comprises, for example, an alkali-free glass substrate or a glazed ceramic substrate (i.e., a layer of glass having a high softening point formed on the entire surface of the ceramic substrate). On a photo-sensing elements region 52 (first region) of the substrate 31 there is formed a semiconductor layer 32. This layer, for example, is made from a hydrogenated amorphous silicon (a-Si:H), namely, a layer including respectively more than 5 percent of H and more than 20 percent of Si, and formed as a high resistance layer (intrinsic layer) with thickness of 0.5 $\mu$m to 2 $\mu$m. This amorphous silicon layer has a specific resistance of more than $10^{10}\Omega$-cm. At the surface of the semiconductor layer 32, low resistance layers (n+-layer) 33 of a a-Si:H of the thickness of 0.005 $\mu$m to 0.5 $\mu$m doped with P are formed. The reason for providing the low resistance layers 33 is for providing a satisfactory ohmic contact with metals that will be formed on the semiconductor layer 32.

On the semiconductor layer 32, first electrodes 34 are arranged in a predetermined alignment such as in a line. Also, second electrodes 35 are arranged in a line on the semiconductor layer 32. The second electrodes 35 are commonly connected electrodes. Each of the first electrodes 34, and a facing portion 35' of the second electrodes 35 forms an electrode pair. The electrode pair and the semiconductor layer 32 positioned therebetween comprises a photo-sensing element. The first electrodes 34 are respectively extended to a matrix wires region 50 (second region), and are extended to form first wires 36. Further, an insulating layer 37 is formed over the entire surface. Second wires 38 are formed in parallel on the matrix wires region 50 of the substrate 31. Each of the electrodes 34, 35 and wires 36, 38 is made from Ti. The second wires 38 are connected to the first wires 36 at through holes C formed in the insulating layer 37.

Each of the second electrodes 35 has a plurality of gaps 54 corresponding to the photo-sensing elements. Each second electrode 35 has a plurality of portions 35' which form a group 56 of electrode portions facing an equal member of first electrodes 34 which thus also form similar groups 58. Each of the first electrodes 34 is connected jointly via second wires 38 to the corresponding members of each group, namely, among those that have the same position in each group.

The manufacturing steps are as follows:

At first, after cleansing the substrate 31 with, for example, a mixed solution of hydrogen peroxide and amonia, the a-Si:H layer of the semiconductor layer 32 and the doped a-Si:H layer of the low resistance layer 33 are deposited by the masked plasma CVD method or the like. Then the first and second electrodes 34, 35 and first wires 36 are made from the same layer of Ti by sputtering or vapor deposition and the PEP (photo engraving process) for patterning. Then, the exposing portion of the low resistance layer 33 is etched. Next, the insulating layer 37 is formed. As the material for the insulating layer 37, one may use, for example, polyimide, polyamide, polyethylene-based organic substances, acryl-based organic substances, epoxy-based organic substances, or $SiO_2$, $Si_xN_y$, and $Ta_2O_5$, and especially materials with light transmissivity of more than about 10 percent. Then, by the use of an etchant such as hydrazine, through holes C for the contact of the first wires 36 and the second wires 38 are formed by etching in the insulating layer 37. Here, in the case of using a photosensitive polyimide as the material for the insulating layer 37, use will be made of a developing solution instead of an etchant. Next, using Ti, the second wires 38 are formed by vapor deposition or sputtering and a following PEP process.

In this embodiment the incident light is irradiated from above as shown in FIG. 3b, and the insulating layer 37 surves as a protective layer for the photo-sensing element array.

Figure 4:
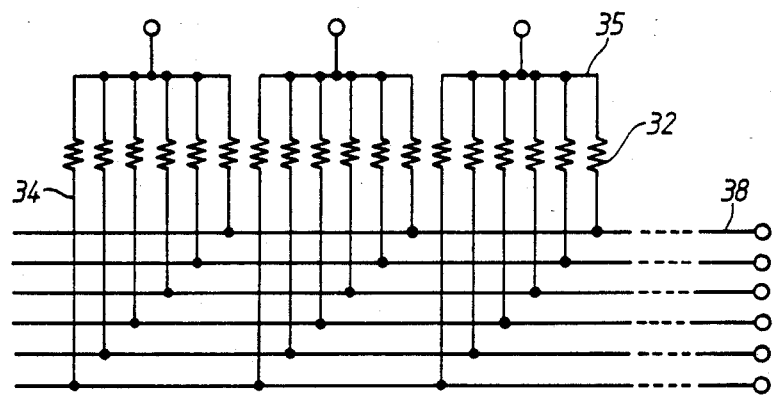
FIG. 4 is a diagram showing an equivalent circuit of an image sensor in FIGS. 3a and 3b.

FIG. 4 is an equivalent circuit diagram for the image sensor shown in FIGS. 3a and 3b.

As may be seen from FIG. 4, it becomes possible to obtain image signals by selecting each group 56 of the photo-sensing element array by the successive application of a driving voltage to the second electrodes 35, and by repeating the operation of successively reading the signal in each group 58 that is obtained based on the change in the resistance in response to the intensity of incident light on the photoconductive layer, through the second wires 38.

According to this embodiment, the electrodes 34, 35 and the wires 36, 38 are made by vapor deposition or sputtering and the PEP process and contact at through holes. Thus, an image sensor having a relatively small width can be easily obtained. And in the case of forming the semiconductor layer in the band form in the region of the photo-sensing element array, even when there exists an unevenness in the protrusion of the semiconductor layer in its width direction, the insulating layer 37 is nevertheless formed over the entire surface. In this manner, it is possible to establish a satisfactory adhesion of the insulating layer 37, improving the reliability of the image sensor. In other words, the photo-sensing element array and the matrix wires can be formed close to each other, which contributes accordingly to the miniaturization of the image sensor. Further, when the semiconductor layer is formed first, there was a problem that the semiconductor layer is altered by the etchant in the etching process for the insulating layer. However, according to the embodiment, the problem does not occur since the semiconductor layer is protected against the etchant by the insulating layer 37 that is formed from the photo-sensing element array region to the matrix wires region after the formation of the semiconductor layer.

Futhermore, in the embodiment of FIGS. 3a and 3b, it is possible to form the semiconductor layer first on the substrate so that the semiconductor layer can be formed in a state in which the substrate can be cleaned without adversely affecting the insulating layer. Moreover, in the state of forming the photoconductive layer, the substrate surface does not contain material such as an organic resin which would serve as the insulating layer, so that it is possible to form the semiconductor layer having high quality without being affected by the material.

Moreover, according to the embodiment, it is possible to form the protective insulating film simultaneously with the formation of the insulating layer isolating the first wires 36 and the second wires 38, so that the number of processes can be reduced as compared with the method in which the additional protective insulating layer is formed.

Figure 5:
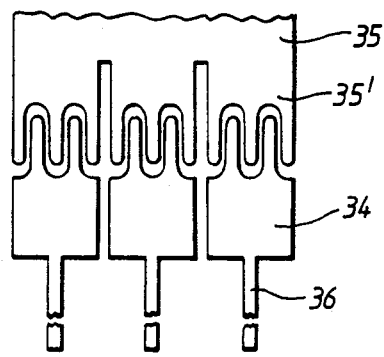
FIG. 5 is a diagram showing a plan view of electrodes attached to an image sensor as another embodiment of the invention.

FIG. 5 is a diagram showing a plan view of electrodes attached to an image sensor as another embodiment of the invention. The same numerals are commonly used for the parts corresponding to ones in FIGS. 3a and 3b. As shown in this figure, as the opposing electrodes 34 and 35 in the photo-sensing element array, use may be made of comb-tooth-like electrodes, which permits one to enhance the sensitivity of the sensor.

Figure 6:
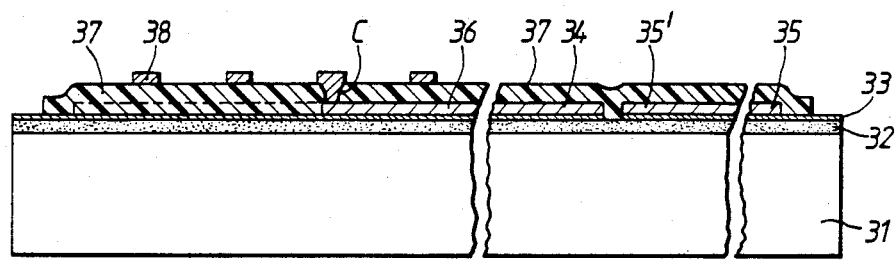
FIG. 6 is a diagram showing a cross-sectional view of an image sensor of another embodiment of the invention.

FIG. 6 is a diagram showing a cross-sectional view of an image sensor of another embodiment of the invention.

Although the semiconductor layer 32 was formed only in the photo-sensing elements region as shown in FIGS. 3a and 3b, it may be formed on the entire surface of the substrate 31 as shown in FIG. 6.

The leak between the elements of the photo-sensing element array (inter-element leak, mainly between the first wires 36) will be considered as follows. In this embodiment the low resistance layer 33 of a-Si:H doped with P is etched at the photo-sensing element region as in the embodiment shown in FIGS. 3a and 3b.

Namely, in reference to FIG. 3a, the resistance of each element in the photo-sensing element array is proportional to $L_1/W_1$, where $L_1$ is the gap width between the opposing electrodes 34 and 35 and $W_1$ is the length of the gap between the electrodes 34 and 35. On the other hand, the resistance between the elements is proportional to $L_2/W_2$, where $L_2$ is the separation between the wires 36 and $W_2$ is their length. In this case, if the condition $L_1/W_1 << L_2/W_2$ is satisfied, the inter-element leak can be neglected so that there will arise no problem even if the semiconductor layer is formed on the entire surface of the substrate 31 as shown in FIG. 6. As an example, when, for example, $L_1=6$ $\mu m$ and $W_1=500$ $\mu m$, by selecting $L_2=750$ $\mu m$ and $W_2=2$ mm the ratio of the two kinds of resistance becomes 31 so that it will be sufficient for practical use.

Moreover, even when the above condition cannot be satisfied, the inner element leak can be suppressed to a low level by employing a configuration in which there will be no incidence of light on the region other than the photo-sensing elements region of the semiconductor layer 32, for instance, by forming a light shielding film over the matrix wires region 50 or by employing an imaging lens system that permits incidence of light only in the photo-sensing elements region 52. Namely, if the specific resistance of the region where light is incident is Rp, the specific resistance of the region where no light is incident is Rd, the resistance of each element of the photo-sensing element array is proportional to $Rp \times L_1/W_1$, and the inter-element resistance of the photo-sensing element array is proportional to $Rd \times L_2/W_2$, so that the inter-element leak becomes negligible if, $Rp \times L_1/W_1 < < Rd \times L_2/W_2$.

Futhermore, as another method of neglecting the inter-element leak, there may be employed a method of irradiating beforehand the region other than the photo-sensing elements region of the semiconductor layer 32 with a powerful light to change the region to a high resistance by the so-called photo-deterioration effect (i.e., the Staebler-Wronski effect).

Figure 7:
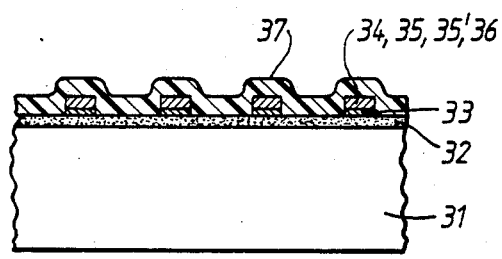
FIG. 7 is a diagram showing a cross-sectional view of an image sensor of another embodiment of the invention.

Still further, in the case of forming the semiconductor layer 32 over the entire surface of the substrate 31, the insulating resistance between the elements of the photo-sensing element array may be made large, by leaving the low resistance layer 33 only in the region beneath the first electrodes 34, second electrodes 35 and first wires 36, by means of etching, after the formation of the electrodes 34, 35 and the wires 36 as shown in FIG. 7. In other words, since it is the case of the high resistance layer 32 being an a-Si:H layer that has a high specific resistance of about $10^{12}\Omega$-cm, the insulation resistance can be secured sufficiently by the above arrangement, and the inter-element leak can be suppressed to a level that will give no problem in practice.

Figure 8:
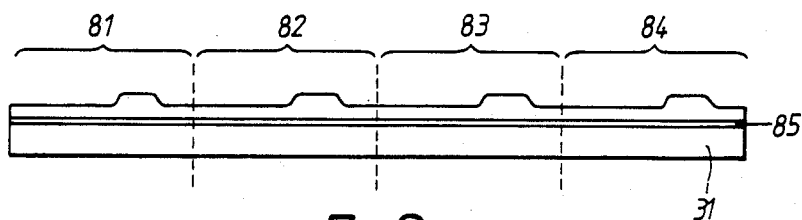
FIG. 8 is a diagram showing a cross-sectional view of a manufacturing step of an image sensor of another embodiment of the invention.

As described above, it is possible to form the semiconductor layer 32 on the entire surface of the substrate 31, which is especially effective in the case when a large number of image sensors are to be formed simultaneously on the same substrate. In an embodiment shown in FIG. 8, a plurality (four in this embodiment) of image sensors 81 to 84, in which each image sensor formation is completed as shown in FIG. 6, are formed on the substrate 31. A plurality of image sensors 81 to 84 may be formed by separating them by dicing at the positions indicated by the broken lines. It thus is possible to manufacture a plurality of image sensors to improve mass productivity since it is not necessary to form the semiconductor layers in the band form corresponding to each image sensor region Rather, the semiconductor layer can be formed continuously onto the substrate. The order of manufacturing steps are common as compared with the foregoing embodiment. In this embodiment, there is interposed an adhesive layer 85 between the semiconductor layer and the substrate 31, to increase the adhesive force of the semiconductor layer to prevent its detachment in dicing. As the adhesive layer 85, the layer that has a silicon nitride ($SiN_x$, $SiN_xO_y$, $SiN_xH_2$, and others) as the principal component is most preferred, and an oxide, a nitride, or a carbide of such metals as Ta, Si, Cr, Al, Ti, and V is also appropriate. In the case of a metallic oxide, it is only necessary to oxidize the surface by anode oxidation or by treating the surface with oxygen plasma, after attaching a material such as Cr, Al, Ti, and V that has a relatively small free formation energy of oxidation on the substrate 31. Further, the $Si_3N_4$ film to be used as the adhesive layer is desirable from the cost point of view to be formed by means of the sputtering method or the plasma CVD method. However, either of the thermal CVD method, the vapor deposition method, the MOCVD method, the ion plating method, the cluster ion beam method, the optical CVD method, or the MBE method may also be employed Moreover, when an adhesive layer is used on the substrate, it becomes possible to use not only a glass but also a metal such as stainless steel as the substrate.

This invention is not restricted to the embodiment described above. For instance, in the embodiments described above, Ti is used as the material of the electrodes 34, 35 and the wires 36, 38, however, other metal such as Cr, Al, Mo, Mn, Nb, V, W, Ta, Sb or stacked metals such as Cr-Al (in which an Al layer is stacked on a Cr layer) can be used instead of Ti. Other stacked metals such as Cr-Cu, Cr-Au, Ti-Au, Ti-Ni and so forth may be used. Furthermore, the incident light is irradiated from above in the embodiment, however, in the case a transparent material is used as the substrate, the inicdent light may be irradiated from below the image sensors.

This invention is not restricted to the specific embodiments described above. Other modifications and improvements of the invention will become apparent to those of skill in the art and the invention is intended to cover such modifications and improvements as defined by the appended claims.

What is claimed is:

1. An image sensor, comprising:
   a substrate;
   a semiconductor layer continuously formed over the entire surface of said substrate;
   a plurality of first electrode formed on said semiconductor layer, said plurality of first electrodes arranged in a predetermined arrangement and electrically connected to said semiconductor layer on a first region of said substrate;
   a plurality of electrode portions formed on said semiconductor layer on said first region of said substrate and arranged in said predetermined arrangement, being electrically connected to said semiconductor layer on said first region, groups of said electrode portions each having a common second electrode formed on said semiconductor layer, said plurality of electrode portions having a predetermined arrangement and positioned adjacent said first plurality of electrodes wherein said electrode portions, said first electrodes and said semiconductor layer positioned therebetween comprise photo-sensing elements;
   first wires formed on said semiconductor layer and respectively extended from said first electrodes to said semiconductor layer on a second region of said substrate;
   an insulating layer formed on said first and second region, covering said photo-sensing elements and said first wires; and
   second wires formed in parallel on said insulating layer of said second region, said second wires electronically connected to said first wires at through holes formed in said insulating layer.

2. An image sensor according to claim 1, wherein said semiconductor layer comprises amorphous silicon.

3. An image sensor according to claim 1, further comprising a low resistance layer of doped amorphous silicon formed between said semiconductor layer and said first and second electrodes.

4. An image sensor according to claim 1, wherein said first electrodes are arranged in different positions forming groups corresponding in number to the number of groups of said electrode portions and wherein each of the first electrodes is connected jointly among said first electrodes that have the same position in each group of first electrodes, by means of said first wires 5. An image sensor according to claim 1, wherein each of said second electrodes have gaps corresponding to said photo-sensing elements 6. An image sensor according to claim 1, wherein said substrate is selected from the group of a glass substrate and a glazed ceramic substrate.

7. An image sensor according to claim 1, wherein said first and second electrodes and first and second wires are made from metals selected from the group of Ti, Cr, Al, Mo, Mn, Nb, V, W, Ta, Sb, stacked metals of Cr-Al, Cr-Cu, Cr-Au, Ti-Au and Ti-Ni.

8. An image sensor according to claim 1, wherein said first and second electrodes are made in the form of comb-tooth-like electrodes.

9. An image sensor according to claim 1, wherein said photo-sensing element changes its resistance corresponding to the intensity of incident light.

10. An image sensor according to claim 1, wherein said insulating layer is transparent material.

11. An image sensor according to claim 1, wherein at least one low resistivity layer is formed between said semiconductor layer and said first electrodes, second electrodes and first wires, except for said first region, wherein the relation $L_1/W_1 < L_2/W_2$ is satisfied, in which $L_1$ is the gap width between said first and second electrode, $W_1$ is the length of the gap between said first and second electrode, $L_2$ is the spacing width between said first wires, and $W_2$ is the length of the first wire.

12. An image sensor according to claim 1, further comprising at least one low resistivity layer formed only between said semiconductor layer and said first electrodes, second electrodes and first wires.

13. An image sensor according to claim 1, wherein incident light is irradiated only to said semiconductor layer of said first region.

14. An image sensor according to claim 1, further comprising an adhesive layer formed between said semiconductor layer and said substrate.

15. An image sensor according to claim 14, wherein said adhesive layer is metal nitride metal oxide or carbide metal.

16. An image sensor according to claim 15, wherein said metal is selected from Ta, Si, Cr, Al, Ti, and V.

17. An image sensor, comprising:
a substrate;
a semiconductor layer extending over the entire surface of the substrate;
a plurality of photo-sensing element arranged in a line on a first region of said substrate, each comprising an electrode pair formed on said semiconductor layer and said semiconductor layer positioned between said electrode pair;
first wires formed on said semiconductor layer and extended from one electrode of said electrode pair to said semiconductor layer on a second region of said substrate;
an insulating layer continuously formed on said first and second regions, covering said photo-sensing elements and said first wires; and
second wires formed in parallel on said insulating layer on said second region, said second wires electrically contacting said first wires at through holes formed in said insulating layer.

18. A method of manufacturing image sensors, comprising the steps of:
(i) forming a semiconductor layer on the entire surface of a substrate;
(ii) forming first electrodes, second electrodes and first wires on said semiconductor layer, said first and second electrodes each arranged in a predetermined relationship facing each other and electrically connected to said semiconductor layer on said first region, each of said second electrodes facing a plurality of said first electrodes, and said first wires respectively extended from said first electrodes to said semiconductor layer on a second region of said substrate;
(iii) forming an insulating layer continuously on said first and second regions, covering said first electrodes, second electrodes and first wires, and said insulating layer having holes corresponding to said first wires;
(iv) forming a conductive layer on said insulating layer; and
(v) patterning said conductive layer to form second wires formed in parallel on said insulating layer of said second region, electrically contacting said first wires at said through holes.

19. A method of manufacturing image sensors according to claim 18, further comprising:
(vi) forming a low resistance layer on said semiconductor layer before said step i); and
(vii) etching said low resistance layer positioned in said first region.

20. A method of manufacturing image sensors according to claim 18 further comprising:
(vi) forming a low resistance layer on said semiconductor layer before said step (ii); and
(vii) etching said low resistance layer except beneath said first electrodes, second electrodes and first wires.

21. A method of manufacturing image sensors according to claim 18, further comprising:
(vi) forming an adhesive layer on said substrate before said step (i).

22. A method of manufacturing image sensors according to claim 21, wherein said adhesive layer is metal nitride, metal oxide or metal carbide.

23. A method of manufacturing image sensors according to claim 22, wherein said metal is selected from Ta, Si, Cr, Al, Ti, and V.

24. A method of manufacturing image sensors, comprising the steps of:
(i) forming a semiconductor layer on the entire surface of a substrate including a plurality of image sensor regions of said substrate;
(ii) forming first electrodes, second electrodes and first wires on said semiconductor layer of each image sensor region, said first and second electrodes arranged in line facing each other, each of said second electrodes adjacent a plurality of said first electrodes, and said first wires electrically connected to said first electrodes;
(iii) forming an insulating layer on covering said first electrodes, second electrodes and first wires;
(iv) forming second wires in parallel on said insulating layer, contacting said first wires at through holes in said insulating layer; and
(v) dicing said substrate to form a plurality of image sensors.

25. A method of manufacturing image sensors according to claim 24, further comprising:
(vi) forming an adhesive layer on said substrate before said step (i).

26. A method of manufacturing image sensors according to claim 25, wherein said adhesive layer is metal nitride, metal oxide or metal carbide.

27. A method of manufacturing image sensors according to claim 26, wherein said metal is selected from Ta, Si, Cr, Al, Ti and V.

* * * * *